(12) United States Patent
Thoelmann

(10) Patent No.: US 9,733,310 B2
(45) Date of Patent: Aug. 15, 2017

(54) BATTERY MANAGEMENT UNIT HAVING A PLURALITY OF MONITORING IC CHIPS

(71) Applicants: Robert Bosch GmbH, Stuttgart (DE); Samsung SDI Co., Ltd., Yongin-si, Gyeonggi-do (KR)

(72) Inventor: Karsten Thoelmann, Moeglingen (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 364 days.

(21) Appl. No.: 14/355,551

(22) PCT Filed: Oct. 4, 2012

(86) PCT No.: PCT/EP2012/069581
§ 371 (c)(1),
(2) Date: Apr. 30, 2014

(87) PCT Pub. No.: WO2013/064322
PCT Pub. Date: May 10, 2013

(65) Prior Publication Data
US 2014/0377602 A1   Dec. 25, 2014

(30) Foreign Application Priority Data

Nov. 4, 2011   (DE) .................. 10 2011 085 787

(51) Int. Cl.
*H01M 10/48*     (2006.01)
*G01R 31/36*     (2006.01)
*H04Q 9/00*      (2006.01)
*H01M 10/42*     (2006.01)
*B60L 3/00*      (2006.01)
(Continued)

(52) U.S. Cl.
CPC ........ *G01R 31/3606* (2013.01); *B60L 3/0046* (2013.01); *B60L 11/1864* (2013.01);
(Continued)

(58) Field of Classification Search
CPC ............. H01M 10/482; G01R 31/3606; G01R 31/3658
See application file for complete search history.

(56) References Cited

U.S. PATENT DOCUMENTS 5,773,962 A * 6/1998 Nor ...................... B60L 11/185
                                                    320/116
5,808,469 A   9/1998 Kopera
(Continued)

FOREIGN PATENT DOCUMENTS

CN          101663592 A       3/2010
DE   10 2004 033 761 A1       2/2006
(Continued)

OTHER PUBLICATIONS

International Search Report corresponding to PCT Application No. PCT/EP2012/069581, mailed Dec. 11, 2013 (German and English language document) (9 pages).

*Primary Examiner* — Karie O'Neill Apicella
(74) *Attorney, Agent, or Firm* — Maginot, Moore & Beck LLP

(57) ABSTRACT

A battery management unit includes a plurality of monitoring IC chips each configured to detect at least one operating parameter of at least one battery cell or battery module, which has a predetermined number of battery cells and is connected to a first bus. The battery management unit further includes a control unit and a basis monitoring IC chip which is likewise connected to the first bus and is configured to communicate with each of the monitoring IC chips via the first bus. The basis monitoring IC chip and the control unit are connected to a second bus and are configured to communicate with each other via the second bus. The basis monitoring IC chip and the control unit are arranged on a common circuit board.

10 Claims, 4 Drawing Sheets

(51) Int. Cl.
  *B60L 11/18* (2006.01)
  *H02J 7/00* (2006.01)
  *H02J 13/00* (2006.01)
(52) U.S. Cl.
  CPC ... *H01M 10/4207* (2013.01); *H01M 10/4257* (2013.01); *H01M 10/482* (2013.01); *H02J 7/0021* (2013.01); *H02J 13/0079* (2013.01); *H04Q 9/00* (2013.01); *B60L 2240/545* (2013.01); *B60L 2240/547* (2013.01); *B60L 2240/549* (2013.01); *B60L 2270/147* (2013.01); *G01R 31/3658* (2013.01); *H01M 2010/4271* (2013.01); *H01M 2220/20* (2013.01); *H04Q 2209/10* (2013.01); *H04Q 2209/30* (2013.01); *Y02T 10/7011* (2013.01); *Y02T 10/7055* (2013.01); *Y02T 10/7061* (2013.01); *Y02T 90/16* (2013.01)

(56) References Cited

U.S. PATENT DOCUMENTS

2007/0247117 A1\* 10/2007 Morita ............... H02J 7/0016
                                              320/132
2011/0140533 A1   6/2011 Zeng et al.

FOREIGN PATENT DOCUMENTS

| EP | 0 798 839 A2   | 10/1997 |
| EP | 1 162 712 A2   | 12/2001 |
| EP | 1 806 592 A1   | 7/2007  |
| EP | 1 933 443 A2   | 6/2008  |
| EP | 2 180 574 A2   | 4/2010  |
| WO | 2006/078850 A2 | 7/2006  |
| WO | 2008/055505 A1 | 5/2008  |
| WO | 2008/108979 A1 | 9/2008  |

\* cited by examiner

BATTERY MANAGEMENT UNIT HAVING A PLURALITY OF MONITORING IC CHIPS

This application is a 35 U.S.C. §371 National Stage Application of PCT/EP2012/069581, filed on Oct. 4, 2012, which claims the benefit of priority to Serial No. DE 10 2011 085 787.7, filed on Nov. 4, 2011 in Germany, the disclosures of which are incorporated herein by reference in their entirety.

The present disclosure relates to a battery management unit having a plurality of monitoring IC chips, to a battery having the battery management unit according to the disclosure and to a motor vehicle having a battery according to the disclosure.

BACKGROUND

Prior Art

Batteries which use lithium ion or nickel metal hydride technology and have a large number of electrochemical battery cells connected in series are nowadays used in hybrid and electric vehicles, in particular. A battery management unit is used to monitor the battery and, in addition to monitoring safety, is intended to provide a service life which is as long as possible. For this purpose, the voltage of each individual battery cell is measured together with the battery current and the battery temperature and the state is estimated (for example the state of charge or the ageing state of the battery). In order to maximize the service life, it is helpful to know the current maximum capacity of the battery, that is to say the maximum electrical power which can be delivered or consumed, at all times. If this capacity is exceeded, the ageing of the battery can be greatly accelerated.

In order to make it possible to accurately measure the voltage of each individual battery cell or at least the voltage of each battery module comprising a predetermined number of battery cells, battery management units are known from the prior art, which units comprise a plurality of monitoring IC (integrated circuit) chips which are connected in series, can carry out voltage measurements, inter alia, and are connected, in the form of a daisy chain, to an internal bus which enables communication between the individual monitoring IC chips without necessitating DC isolation or the use of high-voltage electronics. In this case, the monitoring IC chips are located with their supply voltages, which are delivered by the battery cells or battery modules to be monitored, in a voltage chain and communicate with one another in such a manner that each monitoring IC chip communicates only with an adjacent monitoring IC chip and forwards the communication data which come from monitoring IC chips, which have a higher voltage level, to the monitoring IC chip which is in each case lower in terms of the voltage level.

A base monitoring IC chip which is likewise connected to the first communication bus and can receive messages from each of the monitoring IC chips is arranged at that end of the communication bus which is lowest with regard to the voltage level. In addition, the base monitoring IC chip is connected via a second bus to a control device which receives the forwarded data via this bus. DC isolation is usually provided between the base monitoring IC chip and the control device.

The monitoring IC chips are usually placed in the vicinity of the battery modules associated with them and the connections for communication via the first, internal bus and the second, external bus are implemented by installing cable harnesses.

IC chips which can be configured in accordance with the modular principle either as a base monitoring IC chip at the lower end of the voltage chain—that is to say with an interface for externally communicating with the control device and an interface to a further monitoring IC chip in a voltage chain—or also as a monitoring IC chip in the daisy chain are known from the prior art.

Whereas the first bus which is used for internal communication between the individual monitoring IC chips is usually designed for reduced EMC (electromagnetic compatibility) emission and an increased resistance to EMC irradiation, the second bus which is used for external communication with the control device is usually a standardized and non-proprietary bus which is suitable for communication with a microcontroller included in the control device. In this case, use is usually made of a protocol which, from the point of view of EMC, is not intended to be routed over a relatively long distance via a cable.

SUMMARY

The disclosure provides a battery management unit having a plurality of monitoring IC chips. IC chips are also understood as meaning integrated circuits or microchips. Each of the monitoring IC chips is designed to record at least one operating variable of at least one battery cell. In addition, each of the monitoring IC chips is connected to a first bus. The battery management unit also comprises a base monitoring IC chip which is likewise connected to the first bus. The base monitoring IC chip is designed to communicate with each of the monitoring IC chips via the first bus. The battery management unit also comprises a control device. The base monitoring IC chip and the control device are connected to a second bus and are designed to communicate with one another via the second bus. The base monitoring IC chip and the control device are arranged on a common printed circuit board in this case.

The base monitoring IC chip can be designed to communicate via the first bus using a first bus protocol and via the second bus using a second bus protocol which differs from the first. Typically used as a first bus protocol, which is used for internal communication between the individual monitoring IC chips and to forward their data to the base monitoring IC chip, is a protocol which makes it possible to route the cables associated with the first bus over a longer distance between different printed circuit boards associated with individual battery cells or battery modules and is selected in such a manner that it is generally resistant to EMC and is sufficiently robust with respect to interference irradiation. These are often differential, non-standardized protocols. In contrast, typically used as a second bus protocol, which is used for external communication between the base monitoring IC chip and the control device, is a protocol which is standardized and is not designed to be routed over a relatively long distance on a cable. Examples are an SPI (Serial Peripheral Interface) bus or an $I^2C$ (Inter-Integrated Circuit) bus. Such a protocol produces a high degree of emission with respect to the EMC since high data rates are often transmitted without a differential bus. On the other hand, the typically used protocol is sensitive to electromagnetic irradiation since the data are transmitted in a single-ended manner. If additive interference signals which come from an external interference source are on a cable of the second bus in this case, this can result in the second bus protocol no longer being understood by the connected components. As a result of the fact that the base monitoring IC chip and the control device are arranged on a common printed circuit board, the second bus can also be arranged on the printed circuit board in such a manner that it is protected from electromagnetic irradiation and emission.

It is preferred for the base monitoring IC chip not to be designed to record an operating variable of a battery cell or a battery module. This has the advantage that no measuring cables need to be routed from a battery cell or a battery module to the printed circuit board comprising the base monitoring IC chip. The base monitoring IC chip is therefore not associated with individual battery cells or individual battery modules, like the remaining plurality of monitoring IC chips, but rather is used only to collect the communication data coming from the monitoring IC chips and to forward said data to the control device. Only the cable harness for the internal communication of the first bus must be routed to the printed circuit board comprising the base monitoring IC chip and the control device.

It is also preferred for at least some of the monitoring IC chips to be connected to the first bus in a daisy chain topology.

A DC isolation unit which DC-isolates the base monitoring IC chip and the control device from one another can be arranged on the printed circuit board.

Each of the monitoring IC chips can be designed, in particular, to record a voltage of a battery cell or a battery module.

One preferred embodiment of the disclosure provides for the base monitoring IC chip on the first bus to be configured as a master, and for each of the monitoring IC chips on the first bus to be configured as a slave.

A voltage supply unit which is designed to provide a supply voltage for the base monitoring IC chip can be arranged on the printed circuit board.

The base monitoring IC chip can be designed to record at least one further operating variable of a battery comprising the battery cells, in particular a battery current or a total battery voltage.

Another aspect of the disclosure relates to a battery, preferably a lithium ion battery, having a battery management unit according to the disclosure and to a motor vehicle having a battery according to the disclosure.

BRIEF DESCRIPTION OF THE DRAWINGS

Exemplary embodiments of the disclosure are explained in more detail using the drawings and the following description. In the drawings.

DETAILED DESCRIPTION

Figure 1:
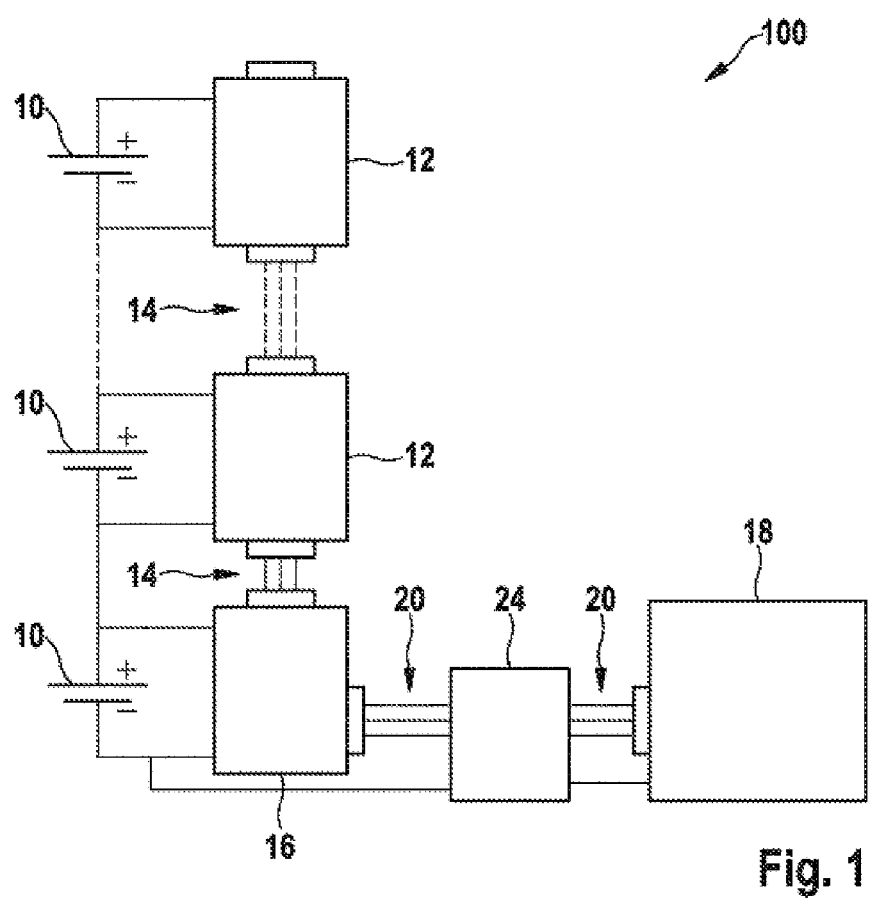
FIG. 1 shows a battery management unit according to the prior art.

FIG. 1 shows a battery management unit according to the prior art which is part of a battery denoted overall with 100. The battery management unit comprises a plurality of monitoring IC chips 12 which are connected to an internal bus 14 in a daisy chain topology. Each of the monitoring IC chips 12 is designed to measure a voltage applied to a battery module 10 associated with it, a battery module 10 comprising a predetermined number of battery cells, for example six to twelve battery cells (only schematically illustrated in FIG. 1). The battery module 10 may also comprise only one battery cell, in which case the monitoring IC chip 12 associated with the battery cell measures the individual voltage across the battery cell. The plurality of battery modules 10 are connected in series. Each battery module 10 provides a supply voltage to the monitoring IC chip 12 associated with it, with the result that the plurality of monitoring IC chips 12 are in an ascending voltage chain.

Each monitoring IC chip 12 receives, via the internal bus 14, data from a monitoring IC chip 12 which is possibly superordinate to it in the voltage chain and forwards the received data, together with data produced by itself, to the adjacent monitoring IC chip 12 which is lower in the voltage chain. Arranged at the lower end of the voltage chain is a base monitoring IC chip 16 which receives all forwarded data which come from the monitoring IC chips 12 and forwards said data, via an external bus 20 to which it is connected, to a control device 18 which is likewise connected to the external bus 20 and comprises one or two microcontrollers. Each monitoring IC chip 12 is arranged on its own printed circuit board which is arranged in the vicinity of the battery module 10 associated with it.

The internal bus 14 uses a differential protocol which is selected, with respect to robustness and electromagnetic compatibility, in such a manner that the cables of the internal bus 14 can be routed over a relatively long distance and over a plurality of printed circuit boards without interfering with communication on the internal bus 14. In contrast, a bus protocol which is transmitted in a single-ended manner and is optimized for communication with a microcontroller is used on the external bus 20. Such a protocol is more susceptible to interference with regard to electromagnetic compatibility and, in particular, is not designed to be transmitted over a relatively long distance of a cable.

A DC isolation unit 24 isolates the base monitoring IC chip 16 and a first part of the external bus 20 from one another, on the one hand, and isolates a second part of the external bus 20 and the control device 18 from one another, on the other hand. A voltage supply for the first part of the external bus 20 is also provided in the DC isolation unit 24.

Figure 2:
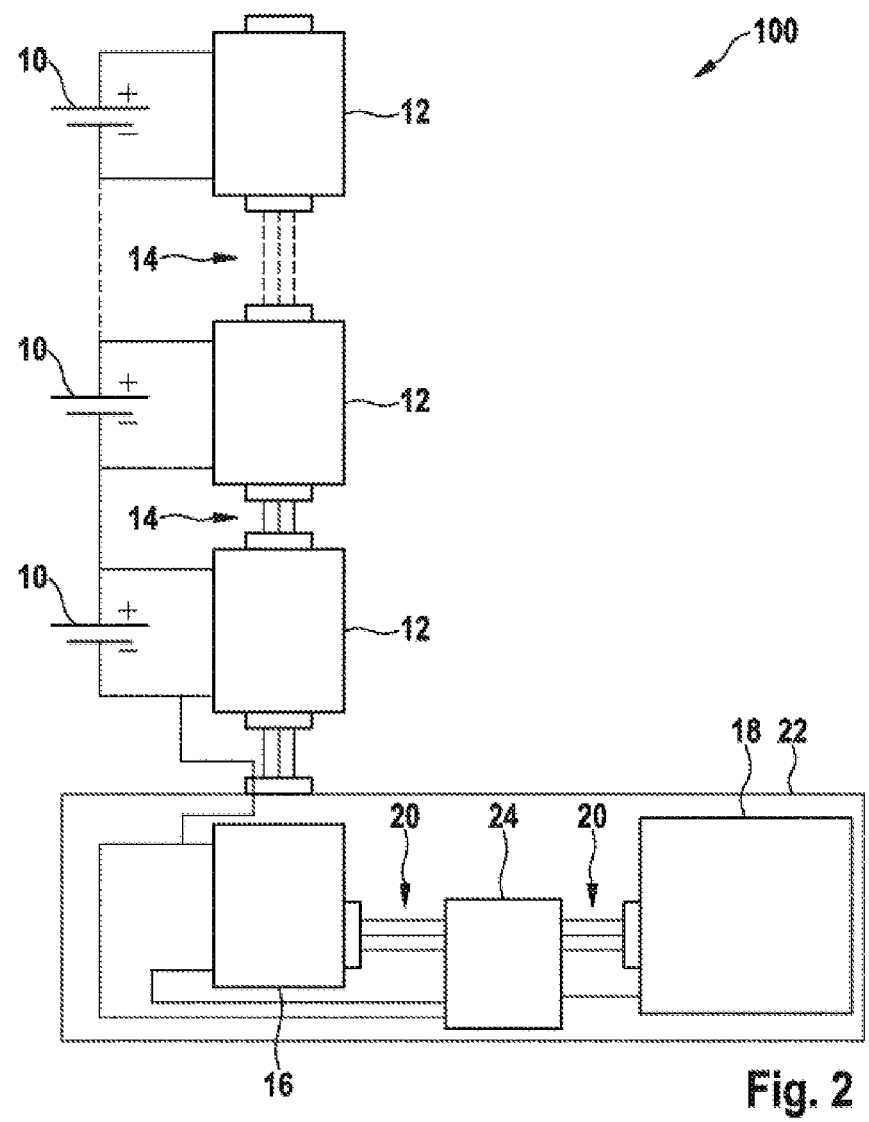
FIGS. 2 and 3 show a battery management unit according to a first embodiment of the disclosure.

FIG. 2 shows a battery management unit according to a first embodiment of the disclosure. In contrast to the battery management unit according to the prior art illustrated in FIG. 1, the battery management unit according to the disclosure has a common printed circuit board 22 on which the base monitoring IC chip 16 and the control device 18 are arranged. The base monitoring IC chip 16 is not associated with a battery module 10. Rather, only the remaining monitoring IC chips 12 are each associated with a battery module 10 whose voltage is measured by the chips. As a result of the fact that a battery module is not associated with the base monitoring IC chip 16, it is not necessary to route measuring cables from a battery module to the printed circuit board 22 of the control device.

The base monitoring IC chip 16 which is at the lower end of the voltage chain formed by the plurality of monitoring IC chips 12 arranged in a daisy chain topology receives the data forwarded by the plurality of monitoring IC chips 12 via the internal bus 14 and transmits said data to the control device 18 via the external bus 20. As a result of the fact that the base monitoring IC chip 16 and the control device 18 are arranged on a common printed circuit board, the external bus 20 can be arranged on the printed circuit board in such a manner that it is protected from electromagnetic irradiation and emission. For example, the external bus 20 can be laid over a continuous earth layer of the printed circuit board 22, as a result of which it is protected from electromagnetic interference. The connection between the base monitoring IC chip 16 arranged on the printed circuit board 22 and the first module 10 used to measure the battery voltage is provided by the cable harness of the internal bus 14 which has better EMC properties than the external bus 20.

A DC isolation unit 24 is arranged on the printed circuit board 22 and DC-isolates the base monitoring IC chip 16 and the control device 18 from one another.

In the configuration illustrated in FIG. 2, the base monitoring IC chip 16 on the first bus 14 can be configured as a master and each of the monitoring IC chips 12 can be configured as a slave.

Figure 3:
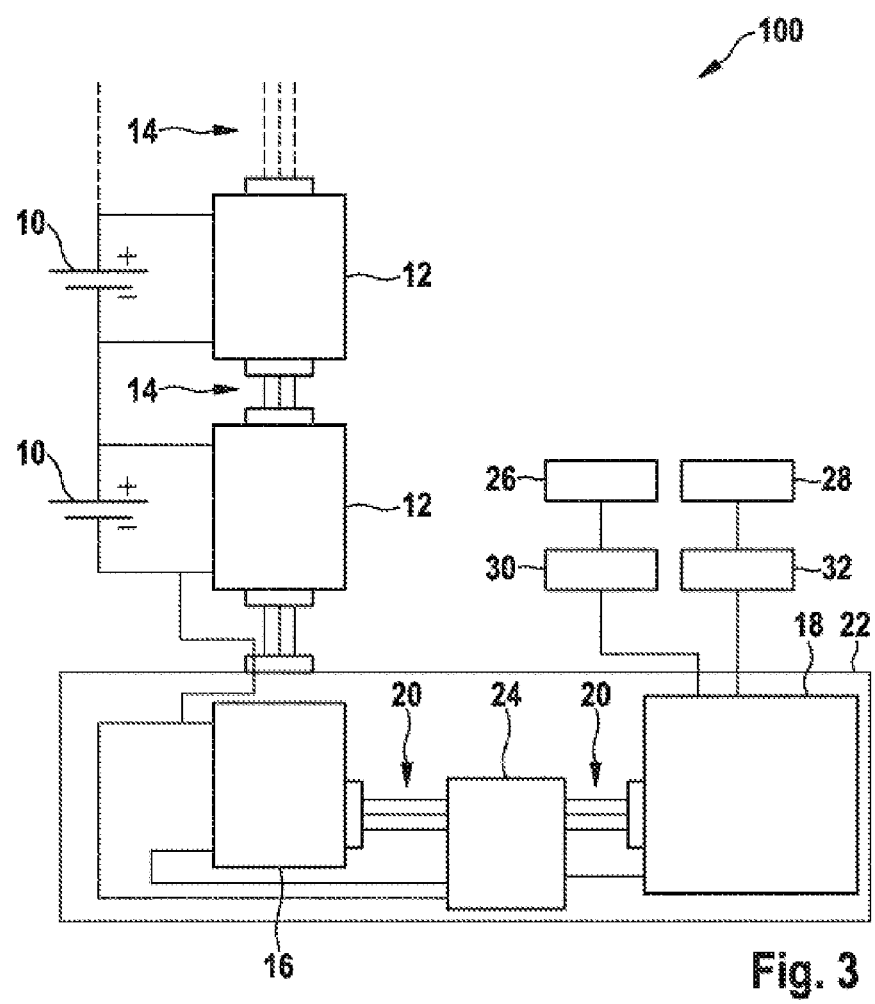

The battery management unit according to the first embodiment of the disclosure can also be configured in such a manner that the control device 18 records further measurement variables which are relevant to estimating the correct method of operation of the battery 100, as illustrated in FIG. 3. A current measuring device 26 records a battery current flowing through the battery 100. A voltage measuring unit 28 measures a total voltage of the battery 100. Both measuring devices 26, 28 transmit their measurement data to the control device 18 via DC isolation units 30, 32. The relevant measurement variables correspond to variables which are electrically associated with the battery 100.

Figure 4:
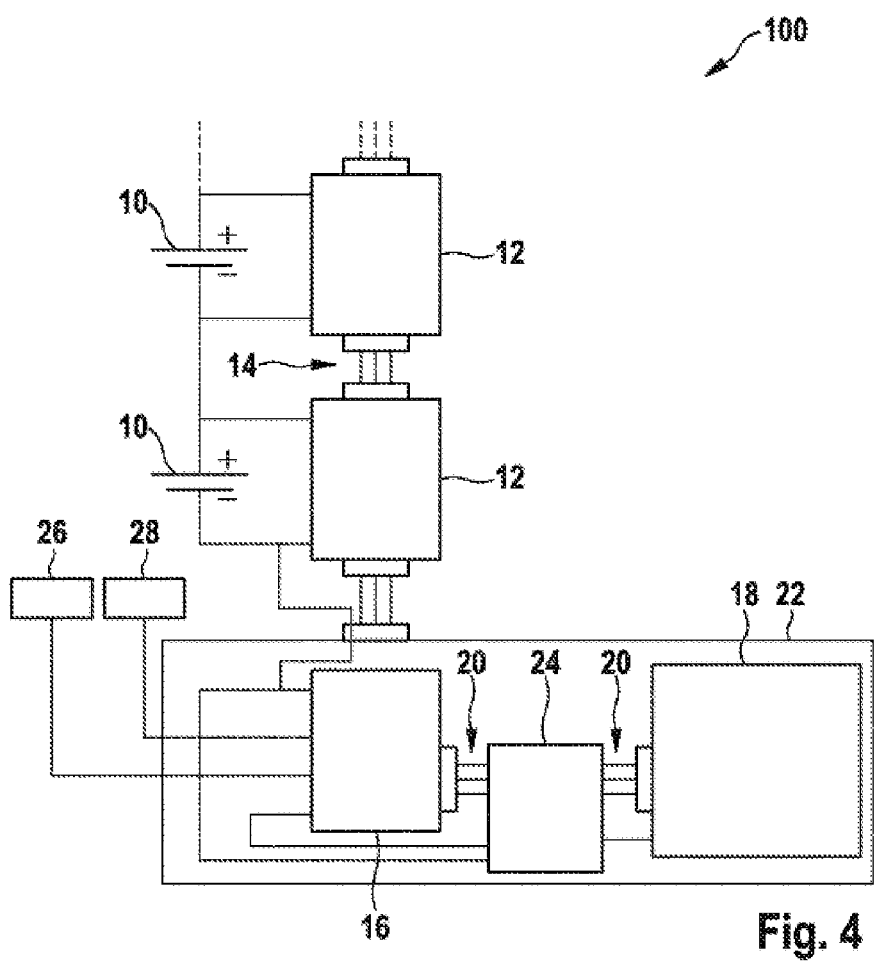
FIG. 4 shows a battery management unit according to a second embodiment of the disclosure.

FIG. 4 shows a battery management unit according to a second embodiment of the disclosure which differs from the embodiment illustrated in FIG. 3 in that the measurement data determined by the measuring units 26, 28 are transmitted to the base monitoring IC chip 16. As a result of the fact that the base monitoring IC chip 16 is DC-isolated from the control device 18 by the DC isolation unit 24, there is no need for additional DC isolation of the measuring units 26, 28 in this case, as implemented by the DC isolation units 30, 32 in FIG. 3. This is advantageous because this DC isolation is always associated with a large amount of effort which has an effect on the costs of the battery management unit.

As a result of the fact that the base monitoring IC chip 16 is not associated with a battery module 10 and does not measure the voltage of a battery module 10, it typically has unused measuring inputs which can be used to measure other parameters which are also associated with the potential of the battery voltage. These measured values can then be transmitted to the control device 18 via the external bus 20 and via the DC isolation unit 24 which is already present. The modules used as the base monitoring IC chip 16 can typically measure six to twelve battery voltages and two to six temperatures using NTC (negative temperature coefficient) measuring sensors and usually also have one freely available input at which a voltage can be measured. The unused inputs are therefore available for measuring other voltages, with appropriate connection. Other parameters which have to be determined by the control device 18 can therefore be measured using appropriate matching circuits with the aid of these unused inputs. This dispenses with the DC isolation usually required for these measurements and with the required digitization of the measured values.

The invention claimed is:

1. A battery management unit comprising:
   a plurality of monitoring integrated circuits, each of the monitoring integrated circuits being configured to record at least one operating variable of at least one battery cell or a battery module including a predetermined number of battery cells and each of the monitoring integrated circuits being connected to a first bus;
   a base monitoring integrated circuit which is likewise connected to the first bus and is configured to communicate with each of the monitoring integrated circuits via the first bus, wherein the base monitoring integrated circuit is not configured to record an operating variable of the at least one battery cell or the battery module; and
   a control device, the base monitoring integrated circuit and the control device being connected to a second bus and being configured to communicate with one another via the second bus, and the base monitoring integrated circuit and the control device being located on a common printed circuit board.

2. The battery management unit as claimed in claim 1, wherein the base monitoring integrated circuit is configured to communicate via the first bus using a first bus protocol and via the second bus using a second bus protocol.

3. The battery management unit as claimed in claim 1, wherein the second bus is located on the printed circuit board in such a manner that the second bus is protected from electromagnetic irradiation and emission.

4. The battery management unit as claimed in claim 1, wherein at least some of the monitoring integrated circuits are connected to the first bus in a daisy chain topology.

5. The battery management unit as claimed in claim 1, further comprising:
   a DC isolation unit configured to DC-isolate the base monitoring integrated circuit and the control device from one another and located on the printed circuit board.

6. The battery management unit as claimed in claim 1, wherein each of the monitoring integrated circuit is configured to record a voltage of the at least one battery cell or the battery module.

7. The battery management unit as claimed in claim 1, wherein the base monitoring integrated circuit on the first bus is configured as a master, and each of the monitoring integrated circuits on the first bus are configured as a slave.

8. The battery management unit as claimed in claim 1, further comprising a voltage supply unit configured to provide a supply voltage for the base monitoring integrated circuit and located on the printed circuit board.

9. A battery comprising:
   a plurality of battery cells; and
   a battery management unit including
      a plurality of monitoring integrated circuits, each of the monitoring integrated circuit being configured to record at least one operating variable of at least one battery cell of the plurality of battery cells and each of the monitoring integrated circuits being connected to a first bus,
      a base monitoring integrated circuit which is likewise connected to the first bus and is configured to communicate with each of the monitoring integrated circuits via the first bus, wherein the base monitoring integrated circuit is not configured to record an operating variable of the plurality of battery cells, and
      a control device, the base monitoring integrated circuit and the control device being connected to a second bus and being configured to communicate with one another via the second bus, and the base monitoring integrated circuit and the control device being located on a common printed circuit board.

10. An electric motor vehicle, comprising:
   a battery including a plurality of battery cells and a battery management unit having (i) a plurality of monitoring integrated circuits, each of the monitoring integrated circuits being configured to record at least one operating variable of at least one battery cell of the plurality of battery cells and each of the monitoring integrated circuits being connected to a first bus, (ii) a base monitoring integrated circuit which is likewise connected to the first bus and is configured to communicate with each of the monitoring integrated circuits via the first bus, wherein the base monitoring integrated circuit is not configured to record an operating variable of the plurality of battery cells, and (iii) a control device, the base monitoring integrated circuit and the control device being connected to a second bus and being configured to communicate with one another via the second bus, and the base monitoring integrated circuit and the control device being located on a common printed circuit board.

* * * * *